United States Patent [19]

Benedikt et al.

[11] Patent Number: 4,923,678

[45] Date of Patent: May 8, 1990

[54] LOW DIELECTRIC CONSTANT PREPREG BASED ON BLENDS OF POLYNORBORNENE AND POLYOLEFINS DERIVED FORM $C_2$-$C_4$ MONOMERS

[75] Inventors: George M. Benedikt, Macedonia, Ohio; Linwood P. Tenney, Birmingham, Ala.

[73] Assignee: The B. F. Goodrich Company, Akron, Ohio

[21] Appl. No.: 309,857

[22] Filed: Feb. 14, 1989

[51] Int. Cl.$^5$ .............................................. B32B 9/00
[52] U.S. Cl. .................................... 428/209; 428/220; 428/224; 428/260; 428/289; 428/290; 428/332; 428/411.1; 428/457; 428/458; 428/480; 428/539.5; 428/577; 428/615; 428/901; 427/96; 156/60; 156/228; 430/311; 430/313; 430/315; 430/319
[58] Field of Search ..................... 427/96; 156/60, 228; 430/311, 313, 315, 319; 361/397; 174/68.5; 428/209, 224, 260, 289, 290, 411.1, 457, 458, 480, 539.5, 220, 332, 577, 615, 801; 526/280; 525/210; 524/304

[56] References Cited

U.S. PATENT DOCUMENTS

| | | |
|---|---|---|
| 3,318,758 | 5/1967 | Tell . |
| 3,508,983 | 4/1970 | Origer et al. . |
| 3,558,423 | 1/1971 | Rossetti, Jr. . |
| 4,136,247 | 1/1979 | Tenney et al. . |
| 4,178,424 | 12/1979 | Tenney et al. . |
| 4,241,132 | 12/1980 | Pratt et al. . |
| 4,292,106 | 9/1981 | Herschdorfer et al. . |
| 4,315,970 | 2/1982 | McGee . |
| 4,329,270 | 5/1982 | Meyer, Jr. et al. ................ 525/210 |
| 4,366,280 | 12/1982 | Yukawa ............................ 524/304 |
| 4,372,800 | 2/1983 | Oizumi et al. . |
| 4,444,951 | 4/1984 | Mendelson ........................ 525/210 |
| 4,451,317 | 5/1984 | Oizumi et al. . |
| 4,571,279 | 2/1986 | Oizumi et al. . |
| 4,639,285 | 1/1987 | Suzuki et al. . |
| 4,831,094 | 5/1989 | Stein et al. ........................ 526/280 |

OTHER PUBLICATIONS

Chemical Abstract No. 98:162024m, "Metal Covered Laminates".
Chemical Abstract No. 98:162025n, "Metal Covered Laminates".
Chemical Abstract No. 98:162026p, "Metal Covered Laminates".
Chemical Abstract No. 72:124634r, "Hybrid Polyimide/Epoxy Glass Multilayer Fabrication".
Chemical Abstract No. 105:135048d, "Multi-Layer Circuit Boards".
Chemical Abstracts No. 107:97841p, "Polycyclic Olefin Laminated Boards".
Chemical Abstract No. 107:8574p, "Epoxy Prepregs for Printed-Wiring Boards".
Chemical Abstract No. 107:8575q, "Epoxy Prepregs for Printed-Wiring Boards".
WPI No. 83-00996K/01, "Metal Glass Laminated Plate Manufacture Using Adhesive Comprising Silyl-Modified Organic Polymer".
WPI No. 83-759725/37, "Bonding Copper Foil to Backing Material Using Silane Compound as Adhesion Promoter; PCB Print Circuit Board".
WPI No. 74-34559V/19, "Metallized Plastic Substrate, e.g., Electronic Circuit—By Laminating Pretreated Metal Sheet with Plastic Substrate, Removing Metal Layer, and Metallizing Exposed Surface".
WPI No. 85-162927/27, "Copper Coated Laminated Plate Production for PCB, Using Unsaturated Resin, e.g., Polyester or Vinyl Ester to Impregnate Base Material".
"Today's Substrates", Murray, *Circuits Manufacturing*, Nov. 1987, p. 25.
"G-10FR Epoxy/Glass Fabric General Purpose Laminate", Norplex, Product Bulletin.
"Adhesion in Mineral-Organic Composites", D. M. Brewis, D. Briggs, John Wiley & Sons, *Industrial Adhesion Problems*, Chapter 6.
*The Kirk-Othmer Encyclopedia of Chemical Technology*, John Wiley & Sons, 1982, vol. 20.
"Some Approaches to Low Dielectric Constant Matrix Resins for Printed Circuit Boards", Butler et al., 15th National SAMPE Technical Conference, 1983.

*Primary Examiner*—Patrick Ryan
*Attorney, Agent, or Firm*—Venable, Baetjer, Howard & Civiletti

[57] ABSTRACT

This invention provides improved prepregs for producing laminates and improved laminates using such prepregs. Processes for producing the prepregs and the laminates are also provided. Processes for producing the prepreg include the steps of providing a dipping solution or suspension comprising a polynorbornene polymer, a polyolefin polymer derived from $C_2$-$C_4$ monomers, and a solvent followed by impregnating a non-cellulosic cloth with the solution. The solvent is removed from the cloth to form the prepreg. Printed circuit boards are also provided by a process which includes the steps of providing such a prepreg and pretreating the surface of a conductive film with a solution of a silane compound, effective to increase the bond strength between the copper foil and the prepreg, followed by laminating the prepreg to the conductive film.

31 Claims, No Drawings

LOW DIELECTRIC CONSTANT PREPREG BASED ON BLENDS OF POLYNORBORNENE AND POLYOLEFINS DERIVED FORM $C_2$–$C_4$ MONOMERS

BACKGROUND OF THE INVENTION

The present invention relates to improved prepregs and methods of producing them. In particular, the invention relates to improved printed circuit wiring boards having a low dielectric constant prepared from such prepregs, and to methods for producing such printed circuit wiring boards.

Conventional printed circuit wiring boards are prepared from "prepregs" which, in turn, are typically prepared by pretreating a cloth substrate, e.g., a fiberglass cloth substrate, with a polymer resin, as by dipping in a solution of resin. The resin is selected so as to provide good strength and low dielectric constant. The solution is then dried to remove the solvent and provide a resin-impregnated prepreg or substrate. Advantageously, the glass substrate is treated with a silane compound to promote adhesion between the substrate and the resin. Such laminates are compared in the market place for such factors as dielectric constant, dissipation factor, chemical resistance, peel strength, solder bath resistance (resistance to delamination when immersed in molten solder), warping and punchability. It is particularly desirable that the dielectric constant of such laminates be low. Accordingly, skilled workers increasingly seek to lower the dielectric constant of such laminates and increase the bond strength between laminations.

CA 106:51353g discloses laminated printed circuit boards having good heat resistance and low dielectric constant comprising non-woven glass fabric impregnated with polybutadiene and diallyl phthalate.

Fibrous materials, e.g., cellulosic and fiberglass woven materials, have long been used to reinforce polymer substrates. It is also known that silane coupling agents can be applied directly to glass filaments to improve the flexural strength of laminates prepared from glass cloth impregnated with polymeric resins. Typical strength increases can be as much as 300% for compression molded test samples. Silane coupling agents have also been employed with the minerals which are used as reinforcing fillers in composites to increase strength, hardness, modulus, heat distortion and impact strength. Fiberglass cloth is typically treated with an aqueous coupling agent.

In the preparation of printed circuit wiring boards using prepregs, two or more prepregs, prepared as discussed above, are pressed together to form an insulating layer for a printed circuit wiring board. To provide the conductive layer, one or more layers of a conductive film, e.g., a copper film, are placed on the outside of the prepregs and laminated to the prepregs at the same time the prepregs are laminated to each other. Alternatively, the conductive film can be applied by vapor deposition, electroplating, sputtering, ion plating, spraying and layering. Typical metals employed include copper, nickel, tin, silver, solder, gold, aluminum, platinum, titanium, zinc and chrome, with copper being used most often in printed wiring boards.

A problem associated with such constructions is the difficulty in applying conductive films so that they bond well to the surface of the prepreg. In fact, prior workers have not been able to form a complete bond having excellent bond strength between the metallic layer and the substrate, and subsequently good solder resistance.

Silane compounds have found wide acceptability for improving adhesion between different substrates. Silane coupling agents modify the interface between metal or mineral surfaces and organic resins to improve adhesion between the surface and the resin. The physical properties and water resistance of the reinforced resins are thereby improved. It is believed that silane coupling agents form bonds with metal surfaces through the silane functional group. The hydrolyzed silanes will condense to oligomeric siloxanols and eventually to rigid cross-linked structures. Contact with a polymer matrix should take place while the siloxanols still have some solubility. Bonding to a polymer matrix may take different forms or a combination of forms. Bonding may be covalent where the oligomeric siloxanol is compatible with the liquid matrix resin. The solutions might also form an interpenetrating polymer network as the siloxanols and the resin separately cure with only limited copolymerization.

Prepregs composed of copolymers have been employed in the past. For example, CA 106:51353g discloses printed circuit laminates comprising 1,2-polybutadiene and diallyl phthalate or polymers thereof.

CA 106: 51354h discloses adhesive compositions employing isobutylene-maleic anhydride-styrene terpolymers.

It is well known that not all silanes or mixtures of silanes will bond all metals to all substrates. McGee, 4,315,970, states that "it is generally accepted that specific silanes can be used for adhesion of specific materials to specific substrates. That is, the silane must be matched to the application and it cannot be assumed that all silanes will work in all applications." Therefore, the suitability of a silane bonding agent in improving adhesion of a metal to a substrate is unpredictable and it must be determined by experimentation.

While suitable coupling agents are commercially available for bonding of many common plastics with a variety of metals, the application of silane coupling agents for bonding of polynorbornenes to metals is not previously known. Norbornene type monomers are polymerized by either a ring-opening mechanism or by an addition reaction wherein the cyclic ring structure remains intact. Ring-opening polymerizations are discussed with greater particularity in U.S. 4,136,247 and 4,178,424, assigned to the same assignee as the present invention and incorporated herein by reference for their discussion of such polymerizations. Ring-opening polymerization generally yields unsaturated linear polymers while addition polymerization yields polycycloaliphatics. It is desirable to produce polymers having high molecular weight monomers incorporated therein to provide good temperature resistance, i.e., high heat distortion temperatures and high glass transition temperatures.

SUMMARY OF THE INVENTION

The invention provides printed circuit wiring boards, prepregs for making such boards, and processes for producing such prepregs and boards (laminates).

The prepregs of this invention comprise a core formed of a mixture of polynorbornene and polyolefin derived from $C_2$–$C_4$ monomers, with reinforcing material, e.g., glass fiber cloth. In one aspect of this invention, they are prepared by providing a dipping solution comprising a polynorbornene dissolved in a solvent and polyolefin dissolved or suspended in a solvent. A non-cellulosic cloth is then impregnated with the dipping solution and the solvent is removed to form a prepreg. The prepreg can be employed to produce a printed circuit wiring board. In another aspect of the invention, the surface of a conductive film is pretreated with a solution of a silane compound effective to increase the bond strength between the conductive foil and the prepreg. The prepreg is then laminated to the conductive film across the surface of the pretreated film to form a printed circuit wiring board. The resultant wiring boards have excellent inter-layer adhesion and a dielectric constant of about 2.8 when using E-type glass fiber cloth. Particularly preferred polyolefins comprise polyethylene.

DETAILED DESCRIPTION OF THE INVENTION

This invention provides prepregs and laminates prepared from such prepregs. For example, the invention provides printed wiring boards having superior dielectric properties. The prepregs comprise fiberglass cloth reinforced with resins, and in particular, a mixture of a polynorbornene and a polyolefin. The printed circuit wiring boards comprise at least one of such prepregs, preferably more than one, laminated together with at least one layer of metallic film or foil. Preferably the metallic film is a copper foil which has been pretreated with an adhesion promotion agent. Silane compounds are particularly preferred adhesion promotion agents.

The prepregs are derived from a dipping solution which comprises norbornene polymers dissolved in a solvent and polyolefin polymers dissolved or suspended in a solvent. The polyolefin polymers are fully conventional. Suitable polyolefins include polyolefins derived from monomers containing from 2–4 carbon atoms. For example, polyethylene (polyethene), polybutylene (polybutene) and polypropylene (polypropene) are particularly suitable polyolefins. Polyethylene is particularly preferred. However, throughout the specification, polyethylene is used in an illustrative sense. Thus, those of ordinary skill in the art will readily comprehend that polypropylene and polybutylene can readily be interchanged for polyethylene. Moreover, mixtures of the various polyolefins can be employed as well.

The polynorbornene polymers are obtained from metathesis ring-opening polymerization of cycloolefin monomers having a norbornene functional group.

These cycloolefin monomers are characterized by the presence of at least one norbornene moiety identified below, in its structure:

Suitable cycloolefin monomers include substituted and unsubstituted norbornenes, dicyclopentadienes, dihydrodicyclopentadienes, trimers of cyclopentadiene, tetracyclododecenes, hexacycloheptadecenes, ethylidenyl norbornenes and vinylnorbornenes. Substituents on the cycloolefin monomers include hydrogen, alkyl, alkenyl, and aryl groups of 1 to 20 carbon atoms, and saturated and unsaturated cyclic groups of 3 to 12 carbon atoms which can be formed with one or more, preferably two, ring carbon atoms. In a preferred embodiment, the substituents are selected from hydrogen and alkyl groups of 1 to 2 carbon atoms. Generally speaking, the substituents on the cycloolefin monomers can be any which do not poison or deactivate the polymerization catalyst. Examples of the preferred monomers referred to herein include
dicyclopentadiene,
methyltetracyclododecene,
2-norbornene,
and other norbornene monomers such as
5-methyl-2-norbornene,
5,6-dimethyl-2-norbornene,
5-ethyl-2-norbornene,
5-ethylidenyl-2-norbornene (or 5-ethylidene-norbornene),
5-butyl-2-norbornene,
5-hexyl-2-norbornene,
5-octyl-2-norbornene,
5-phenyl-2-norbornene,
5-dodecyl-2-norbornene,
5-isobutyl-2-norbornene,
5-octadecyl-2-norbornene,
5-isopropyl-2-norbornene,
5-phenyl-2-norbornene,
5-p-toluyl-2-norbornene,
5-α-naphthyl-2-norbornene,
5-cyclohexyl-2-norbornene,
5-isopropenyl-norbornene,
5-vinyl-norbornene,
5,5-dimethyl-2-norbornene,
tricyclopentadiene (or cyclopentadiene trimer),
tetracyclopentadiene (or cyclopentadiene tetramer),
dihydrodicyclopentadiene (or cyclopentenecyclopentadiene co-dimer),
methyl-cyclopentadiene dimer,
ethyl-cyclopentadiene dimer,
tetracyclododecene,
hexacycloheptadecene,
9-methyl-tetracyclo[6,2,1,1$^{3,6}$, 0$^{2,7}$]dodecene-4, (or methyl-tetracyclododecene)
9-ethyl-tetracyclo[6,2,1,1$^{3,6}$, 0$^{2,7}$]dodecene-4, (or ethyl-tetracyclododecene)
9-propyl-tetracyclo[6,2,1,1$^{3,6}$, 0$^{2,7}$]dodecene-4,
9-hexyl-tetracyclo[6,2,1,1$^{3,6}$, 0$^{2,7}$]dodecene-4,
9-decyl-tetracyclo[6,2,1,1$^{3,6}$, 0$^{2,7}$]dodecene-4,
9,10-dimethyl-tetracyclo[6,2,1,1$^{3,6}$0$^{2,7}$]dodecene-4,
9-methyl,10-ethyl-tetracyclo[6,2,1,1$^{3,6}$0$^{2,7}$]dodecene-4,
9-cyclohexyl-tetracyclo[6,2,1,1$^{3,6}$, 0$^{2,7}$]dodecene-4,
9-chloro-tetracyclo[6,2,1,1$^{3,6}$, 0$^{2,7}$]dodecene-4,
9-bromo-tetracyclo[6,2,1,1$^{3,6}$,0$^{2,7}$]dodecene-4,
9-fluoro-tetracyclo[6,2,1,1$^{3,6}$,0$^{2,7}$]dodecene-4,
9-isobutyl-tetracyclo[6,2,1,1$^{3,6}$,0$^{2,7}$]dodecene-4,
9,10-dichloro-tetracyclo[6,2,1,1$^{3,6}$, 0$^{2,7}$]dodecene-4.

This invention especially contemplates the use of one or more monomers so as to provide either homopolymers or copolymers upon polymerization. Copolymers are defined as polymers composed of two or more monomers.

Other monomers can form part of the polynorbornenes such as non-conjugated acyclic olefins, monocyclic olefins and diolefins. The non-conjugated acyclic olefins act as chain terminators. Hexene-1 is preferred while 1-butene, 2-pentene, 4-methyl-2-pentene, and 5-(-N ethyl-3-octene are suitable also. They are typically used at a molar ratio of 0.001:1 to 0.5:1 acyclic olefin to cycloolefin monomer.

The polynorbornenes used in forming the printed wire boards of the present invention are obtained by solution polymerization in the presence of a catalyst, and preferably a co-catalyst. For solution polymerization, the catalyst preferably comprises molybdenum or tungsten salts and the co-catalyst preferably comprises dialkylaluminum halides, alkylaluminum dihalides, alkylalkoxy halides or a mixture of trialkylaluminum with an iodine source.

Examples of useful molybdenum and tungsten salts include the halides such as chlorides, bromides, iodides, and fluorides. Specific examples of such halides include molybdenum pentachloride, molybdenum hexachloride, molybdenum pentabromide, molybdenum hexabromide, molybdenum pentaiodide, molybdenum hexafluoride, tungsten hexachloride, tungsten hexafluoride and the like. Other representative salts include those of acetylacetonates, sulfates, phosphates, nitrates, and the like. Mixtures of salts can also be used. The more preferred salts are the molybdenum halides, especially molybdenum pentahalides such as $MoCl_5$.

Specific examples of co-catalysts for ring-opening solution polymerization include alkyl-aluminum halides such as ethylaluminum sesquichloride, diethylaluminum chloride, diethylaluminum iodide, ethylaluminum diiodide, propylaluminum diiodide and ethylpropylaluminum iodide and a mixture of triethylaluminum and elemental iodine.

For solution polymerization, the molybdenum or tungsten salt is generally employed at a level from about 0.01 to about 50 millimoles per mole of total monomer, preferably from about 0.5 to about 10 millimoles per mole of total monomer and, the organoaluminum compounds described above are generally used in a molar ratio of organoaluminum compound to molybdenum and/or tungsten salt(s) of from about 10/1 to about $\frac{1}{3}$ preferably from about 5/1 to about 3/1. Both catalyst and co-catalyst for solution polymerization are normally added after the heating and at the time of polymerization.

Suitable solvents used for the solution polymerization and in forming the dipping solution include aliphatic and cycloaliphatic hydrocarbon solvents containing 4 to 10 carbon atoms such as cyclohexane, cyclooctane and the like; aromatic hydrocarbon solvents containing 6 to 14 carbon atoms which are liquid or easily liquified such as benzene, toluene, xylene and the like; and substituted hydrocarbons wherein the substituents are inert such as dichloromethane, chloroform, chlorobenzene, dichlorobenzene and the like. Optionally present within the dipping solution are curing agents which initiate radical crosslinking such as the peroxides, di-t-butyl peroxide, or 2,5-dimethyl-2,5-di(t-butylperoxy)-hexyne-3. Antioxidants such as hindered phenol antioxidants (Ethyl 330) and polyunsaturated monomeric or oligomeric crosslinkers such as trimethylol propane triacrylate are also optional. The dipping solution has a solids content of preferably about 10% to about 40%. Dipping solutions having concentrations both above and below this range can be used in forming the laminates of the invention.

The polyolefin is added to the dipping solution. Preferably it is added in powdered form. For example, polyethylene powder can be employed. Particularly suitable polyethylenes include MICROTHENE FN 524 and MICROTHENE FN 510, available from USI. It is also possible to employ polyolefin powder prepared from ground or otherwise finely divided polyolefin pellets. Powder particle sizes of 100 micron (0.1 mm) size or less are especially suitable. The polyethylene component is fully conventional, readily available and well-known to those of ordinary skill in the art. Other polyolefins are also fully conventional, readily available, and well known.

Polynorbornene copolymers can be employed as the polynorbornene component. Preferred copolymers include, in a weight to weight ratio, those of 50% to 75% methyltetracyclododecene, to 25% to 50% vinylnorbornenes, based on the total amount of poly-norbornene-type polymer employed. Most preferably, 75% to 90% methyltetracyclo-dodecene to 10% to 25% vinylnorbornene, based on the total weight of norbornene-type polymer is employed.

The polynorbornene-polyolefin blend is preferably employed in a weight ratio of from about 40:60 to about 90:10 of polynorbornene to polyolefin, more preferably from 45:55 to 65:35 polynorbornene to polyolefin. Blends of 50% polynorbornene and 50% polyolefin (1:1) have been found particularly suitable.

Preferably, from about 40 wt.% to about 75 wt.% of polymer blend versus glass, based on the weight of finished prepreg, is present in the prepreg. More preferably from about 55 wt.% to about 70 wt.% is employed. Most preferably, about 65 wt.% polymer blend versus glass is employed based on the weight of the finished dry prepreg.

The dipping solution, or suspension when the polyolefin is in a dispersed form, is impregnated into a non-cellulosic cloth, such as fiberglass to form a substrate layer, often referred to as a prepreg. The cloth may be woven or non-woven. Many glass cloth materials having a variety of surface characteristics are available commercially. In the present invention E-type fiberglass cloth, style 2116, having a surface finish type 642 or 627 made by Burlington Industries is preferred. The glass cloth may be pretreated with a silane solution. A preferred class of pretreating agents is the styryl diamino silanes. This non-cellulosic cloth is impregnated by immersing it in the dipping solution, or suspension when the polyolefin is present in dispersed form, of the polynorbornene diluted in an organic solvent. This can be accomplished at ambient temperatures or at the temperatures above or below ambient temperatures.

The prepreg so produced is typically dried at temperatures between ambient temperature and about 150 C. At the final stages of drying the temperature is preferably maintained above the glass transition temperature (Tg) of the polymer to permit the solvent to diffuse out. If curing agents are present, the temperature is kept sufficiently low to prevent activation of the radical crosslinking.

Under typical conditions, for example, when a high molecular weight $C_2$–$C_4$ polymer is employed, it is not dissolved by the solvent of the dipping solution, but is suspended therein. For example, under most cases, the MICROTHENE powders employed form a suspension. Once impregnated into the prepreg and dried, the prepreg could show some opacity due to phase separation of the polymer components. Typical curing conditions involve placing the dried prepreg in a 180.C. oven and raising the temperature from 180° C. to 220° C. over a 25 minute period. The prepreg is then maintained at 220° C. for another 25 minutes. Under these conditions, the $C_2$–$C_4$ polyolefin phase is melted, and instead of the two-phase mixture which was present before curing, one phase develops. Subsequently, during final curing, a crosslinked product develops.

Commercially, the drying is conducted in a continuous drying system, for example, a continuous drying tower as part of a treater having a temperature gradient from room temperature up to 220° C. Treaters are well known to those of ordinary skill in the art, are fully conventional (they are employed in the production of conventional epoxy prepregs), and can be readily employed in the process of this invention, perhaps with a few routine optimization experiments.

The laminates produced by the present invention incorporate a conductive film such as copper foil. This copper foil can be the surface layer of other metallic films. The copper surface layer is pretreated with a silane solution which increases the bond strength between the substrate and the copper surface layer. Preferably, copper foil of the type manufactured for printed wiring boards with a matte side for lamination to a prepreg is pretreated with such a solution of silane coupling agent before being laminated to the prepreg. Such copper foils are typically about 35 microns thick and have a dendritic bronze matte surface.

According to the present invention several silanes were found to be preferred for bonding substrate layers of polynorbornene impregnated glass to copper layers. The silane coupling agent is preferably in solution at concentrations ranging from about 1% to 10% by weight. Suitable silanes include:
3-methylacryloyloxypropyltrimethoxysilane,
3-(N-styrylmethyl-2-aminoethylamino)propyltrimethoxysilane hydrochloride,
3-(N-allyl-2-aminoethylamino)-propyltrimethoxy-silane hydrochloride,
N-(styrylmethyl)-3-aminopropyltrimethoxysilane hydrochloride,
N-2-aminoethyl-3-aminopropyltrimethoxysilane, and
3-(N-Benzyl-2-aminoethylamino)-propyltrimethoxy silane hydrochloride.

The laminates, such as printed wire boards, are finished by laminating the pretreated conductive layer to the substrate layer (prepreg). Lamination is accomplished in a heated press using pressures above about 700 psi, preferably above 1000–1100 psi and at temperatures between ambient temperature and 250° C., but preferably between 170° C. and 190° C. Preferably the temperature is above the glass transition temperature of the polynorbornene and sufficiently high to activate any peroxide curing agents. At such temperatures, any peroxide curing agent present in the polymer releases an oxygen free-radical which causes crosslinking. Crosslinking provides strength and chemical resistance to the boards. Generally a stack of prepregs may be pressed between a pair of pretreated copper foils. The pretreated bronze side of the copper foil is placed in contact with the prepreg.

The following examples are provided to illustrate preferred embodiments of the present invention. They are not intended to limit the scope of this disclosure to the embodiments exemplified therein. All percentages are by weight unless specified otherwise.

EXAMPLE 1

Step 1

Preparation of 65/35 (wt/wt) Methyltetracyclododecene (MTD) Vinyl-Norbornene (VNB) Copolymer An unsaturated polynorbornene polymer was obtained in the following manner. Into a septum-capped vessel containing 30 g. of molecular sieves were added 81 g. of dry toluene, 10.22 g. of methyl tetracyclododecene, 5.73 g. vinyl norbornene and 4.90 g. hexene-1. The contents were mixed and this mixture was allowed to stand 30 minutes, then transferred to a second vessel by passing it through a micron filter under nitrogen pressure. The vessel was slightly pressurized with nitrogen. To the mixture 0.23 cc of a 25% solution of ethyl-aluminum-sesquichloride (EASC cocatalyst) in dry toluene were introduced by syringe. To this mixture, 1.65 cc of a solution of 2 g. of molybdenum pentachloride catalyst in 39 g. of dry ethylacetate and 84 g. of dry toluene, were also introduced by syringe. Within one minute, an exothermic reaction of the mixture resulted and the mixture became a viscous liquid. After 15 minutes, 60 cc of a 88/12 (wt/wt) mixture of 2-propanol and water was added to the vessel and the contents shaken to inactivate the catalyst. The top layer containing mostly solvents, residual monomers and low molecular weight polymers was poured off. The semisolid bottom layer was redissolved in 100 cc of toluene, washed with water and dried by azeotropic distillation of part of the solvent.

Polymerization was found to be 91% conversion of monomer as calculated by measuring the percent weight solids of the resulting polymer solution. The glass transition temperature (Tg) was found to be 118° C. in the second heat, as calculated from a Differential Scanning Calorimetry curve of a sample of the polymer that was diluted in toluene, precipitated into methanol with stirring, filtered and dried.

Step 2

Preparation of Prepreg

A dipping solution or suspension, to obtain prepregs, was prepared from the polymer solution above as follows. The polymer solution was dissolved in toluene containing 3.5 p.h.r. (parts per hundred resin) LUPERSOL 130 peroxide (LUPERSOL 130 is a trademark of Lucidol, Division of Penwalt Corp.). To this solution a polyethylene fine powder was added (MICROTHENE FN 524 from USI of a melt index of 57 and density 0.925). The amount of polyethylene employed was equal to the amount of polynorbornene employed. An E-type glass cloth, Style 2116 having 642 finish (product of Burlington Industries) was impregnated with dipping solution and dried at room temperature until it was tack-free. The resulting prepreg was then transferred to a mechanical convection oven where drying was continued at successively higher temperatures, i.e., for 15 minutes at 50° C., 15 minutes at 100° C. and 20 minutes at 130° C. The value for polymer uptake versus glass was 65.8.

Step 3

Pretreatment of Copper Foil with a Silane

A commercially available electrodeposited copper foil (product of Gould, Inc.) typically used for fabricating general purpose epoxy printed wiring boards was prepared for laminating to the prepreg. The foil, as purchased, weighed 1 oz. per ft.$^2$, was 35 microns thick and had a roughened matte bronze surface on one side. The treatment method used to roughen the surface is proprietary to Gould, Inc. Such copper foils are preferred, but not essential to the performance of the invention.

The copper foil was dipped in a 10% solution of 3-methacryloyloxypropyltrimethoxysilane (a product of Petrarch Systems, Inc.) in methanol for 30 minutes and was allowed to air dry at room temperature for 15 minutes, then transferred to an oven where drying was completed at 105° C. for 5 minutes.

Step 4

Lamination of Cooper Foil to the Prepregs

Two plies of prepregs were laminated and cured between pretreated copper foils at from 180° C. to 220° C. and 1,000 pounds of pressure per square inch for 30 minutes to provide a laminate. The increase in temperature was gradual at about 2 degrees per minute.

Results

The laminate exhibited a dielectric constant at 1 MHz of about 2.8 using E-type glass as measured on an electric bridge. (A Gen Rad 1687-B Megahertz LC Digibridge.)

EXAMPLE 2

Example 1 was repeated except the polymer employed was 100% polynorbornene polymer described in Step 1. The laminate exhibited a dielectric constant of 3.1.

EXAMPLE 3

Example 1 was repeated except that the $C_2$–$C_4$ polyolefin employed was MICROTHENE FN 510 (melt index 4.5; density 0.924). There was a 69.7% uptake of polymer blend by the glass cloth during the prepregging stage. The laminate exhibited a dielectric constant of 2.8.

EXAMPLE 4

Example 3 was repeated in the absence of polyolefin, i.e., the polymer employed was 100% polynorbornene copolymer described in Example 1, Step 1. The prepreg had a polymer uptake of 70% versus glass and the resulting laminate exhibited a dielectric constant of 3.14.

While this invention has been disclosed in this specification by reference to the details of preferred embodiments of the invention, it is to be understood that this disclosure is intended in an illustrative sense rather than in a limiting sense, as it is contemplated that modifications will readily occur to those skilled in the art, within the spirit of the invention and the scope of the appended claims.

What is claimed is:

1. A printed circuit wiring board comprising at least one layer formed of a woven or non-woven, noncellulosic cloth impregnated with a polymer blend comprising at least one polynorbornene and at least one polyolefin derived from $C_2$–$C_4$ monomers.

2. A printed circuit wiring board of claim 1 wherein the non-cellulosic cloth is woven or non-woven fiberglass.

3. A printed circuit wiring board of claim 1 wherein the polynorbornene polymers are derived from vinylnorbornene monomers polymerized with either methyltetracyclododecene or dicyclopentadiene monomers.

4. A printed wiring board of claim 1 further comprising a conductive film comprising copper or a metal with a copper surface layer, wherein the metal is selected from the group consisting of copper, nickel, silver, gold, aluminum, platinum, titanium, zinc, bronze and chromium.

5. A printed wiring board of claim 1 wherein the non-cellulosic cloth is pretreated with a styryl diamino silane.

6. A printed circuit wiring board of claim 1 wherein the polyolefin polymer is polyethylene.

7. A printed circuit wiring board of claim 6 wherein the polynorbornenes and polyethylene are present in a weight-to-weight ratio of about 1:1.

8. A printed circuit wiring board of claim 1 wherein said non-cellulosic cloth contains from about 40% to about 70%, by weight, of polymer blend, based on the total weight of cloth and polymer blend.

9. A process for producing a prepreg having a low dielectric constant comprising:
(a) providing a solution comprising a polynorbornene polymer dissolved in a solution, a polyolefin polymer derived from $C_2$–$C_4$ monomers in solution or suspension form, and a solvent;
(b) impregnating a non-cellulosic cloth with said solution; and
(c) substantially removing the solvent from the solution impregnated within the non-cellulosic cloth.

10. A process of claim 9 wherein the ratio of polynorbornene polymer to polyolefin polymer is about 1:1, by weight.

11. A process of claim 9 wherein the non-cellulosic cloth comprises glass fibers.

12. A process of claim 11 wherein the glass fibers are impregnated with polymers in an amount of from about 40% to about 70% by weight, based on the total weight of the impregnated fibers.

13. A process of claim 9 wherein the polynorbornene polymer is derived from cycloolefin monomers selected from methyltetracyclododecene, vinylnorbornene and dicyclopentadiene.

14. A process of claim 9 wherein the solution further comprises a curing agent which initiates radical cross-linking and wherein step (c) is conducted at a temperature below the activation temperature of said curing agent.

15. A process of claim 9 wherein the polyolefin polymer is polyethylene.

16. A prepreg of claim 9.

17. A process of producing a printed circuit wiring board, comprising:
(a) providing a solution comprising a polynorbornene polymer dissolved in the solution, a polyolefin polymer derived from a $C_2$–$C_4$ monomer in solution or suspension form, and a solvent;
(b) impregnating a non-cellulosic cloth with said solution and removing the solvent from the cloth to provide a prepreg;
(c) pretreating the surface of a conductive film with a solution of a silane compound effective to increase the bond strength between the conductive film and the prepreg; and
(d) laminating and curing the prepreg to the conductive film, at a temperature above the glass transition temperature of the polynorbornene and, when a curing agent is present, sufficiently high to activate said curing agent.

18. A process of claim 17 wherein the conductive film comprises copper.

19. A process of claim 18 wherein the copper film is provided with a bronze coating.

20. A process of claim 17 wherein said polyolefin is polyethylene.

21. A process of claim 17, wherein the ratio of polynorbornene to polyolefin is about 1:1, by weight.

22. A process of claim 17 wherein the non-cellulosic cloth comprises glass fibers.

23. A process of claim 22 wherein the glass cloth is impregnated with the polymers in an amount of from about 40% to about 70% by weight, based on the total weight of the prepreg.

24. A process of claim 17 wherein the polynorbornene polymer is unsaturated and is derived from a cycloolefin monomer selected from methyltetracyclododecene, vinyl-norbornene and dicyclopentadiene.

25. A process of claim 17 wherein the dipping solution further comprises a curing agent which initiates radical crosslinking and wherein step (c) is conducted at a temperature below the activation temperature of said curing agent.

26. A process of claim 17 wherein the silane is selected from the group consisting of
3-methylacryloyloxypropyltrimethoxysilane.
3-(N-styrylmethyl-2-aminoethylamino)propyltrimethoxysilane hydrochloride,
3-(N-allyl-2-aminoethylamino)-propyltrimethoxysilane hydrochloride,
N-(styrylmethyl)-3-aminopropyltrimethoxysilane hydrochloride,
N-2-aminoethyl-3-aminopropyltrimethoxysilane, and
3-(N-Benzyl-2-aminoethylamino)-propyltrimethoxy silane hydrochloride.

27. A process of claim 17 wherein the laminating step is performed at a temperature above the glass transition temperature of the polynorbornene polymer.

28. A process of claim 17 wherein the laminating step is performed at between ambient temperature and about 250° C.

29. A process of claim 17 further comprising placing two or more prepregs in a stacking sequence with copper layers at the outside of the stack.

30. A printed circuit wiring board produced by the process of claim 17.

31. A printed wiring board of claim 30 wherein the conductive layer is coated with a silane selected from the group consisting of
3-methylacryloxypropyltrimethoxysilane,
3-(N-styrylmethyl-2-aminoethylamino)propyltrimethoxysilane hydrochloride,
3-(N-allyl-2-aminoethylamino)-propyltrimethoxysilane hydrochloride,
N-(styrylmethyl)-3-aminopropyltrimethoxysilane hydrochloride,
2-aminoethyl-3-aminopropyltrimethoxysilane, and
3-(N-benzyl-2-aminoethylamino)-propyltrimethoxysilane hydrochloride.

* * * * *